United States Patent
Yang et al.

(10) Patent No.: US 11,105,869 B2
(45) Date of Patent: Aug. 31, 2021

(54) MAGNETIC RESONANCE IMAGING (MRI) COIL USING TRANSMISSION LINES TO ENFORCE PERIODIC CONDITIONS FOR RESONANCE

(71) Applicant: Quality Electrodynamics, LLC, Mayfield Village, OH (US)

(72) Inventors: Xiaoyu Yang, Indiana, PA (US); Tsinghua Zheng, Chesterland, OH (US); Haoqin Zhu, Mayfield Village, OH (US)

(73) Assignee: Quality Electrodynamics, LLC, Mayfield Village, OH (US)

( * ) Notice: Subject to any disclaimer, the term of this patent is extended or adjusted under 35 U.S.C. 154(b) by 19 days.

(21) Appl. No.: 16/679,477

(22) Filed: Nov. 11, 2019

(65) Prior Publication Data

US 2020/0150200 A1     May 14, 2020

Related U.S. Application Data

(60) Provisional application No. 62/758,832, filed on Nov. 12, 2018.

(51) Int. Cl.
*G01R 33/36*     (2006.01)
*G01R 33/34*     (2006.01)

(52) U.S. Cl.
CPC ... *G01R 33/3628* (2013.01); *G01R 33/34084* (2013.01); *G01R 33/3642* (2013.01)

(58) Field of Classification Search
USPC .................................................. 324/322
See application file for complete search history.

(56) References Cited

U.S. PATENT DOCUMENTS

| | | | |
|---|---|---|---|
| 4,825,162 A | 4/1989 | Roemer et al. | |
| 5,256,971 A * | 10/1993 | Boskamp | G01R 33/3628 324/318 |
| 2007/0229079 A1 * | 10/2007 | Vernickel | G01R 33/3685 324/322 |
| 2019/0310330 A1 * | 10/2019 | Yang | G01R 33/36 |

* cited by examiner

*Primary Examiner* — Rodney E Fuller
(74) *Attorney, Agent, or Firm* — Eschweiler & Potashnik, LLC

(57) ABSTRACT

Embodiments relate to MRI coils and arrays comprising transmission lines to enforce periodic conditions. An example embodiment comprises a MRI RF coil array comprising: a plurality of assemblies, wherein each assembly of the plurality of assemblies comprises: a two-port device of that assembly, wherein the two-port device of that assembly is similar to the two-port device of each other assembly of the plurality of assemblies, and wherein the two-port device of that assembly comprises at least one associated inductor configured to, in a Tx mode, generate at least a portion of a $B_1$ field; and a transmission line of that assembly, wherein a length of the transmission line of that assembly can be similar to a length of the transmission line of each other assembly of the plurality of assemblies, wherein the plurality of assemblies are connected together in a loop.

20 Claims, 10 Drawing Sheets

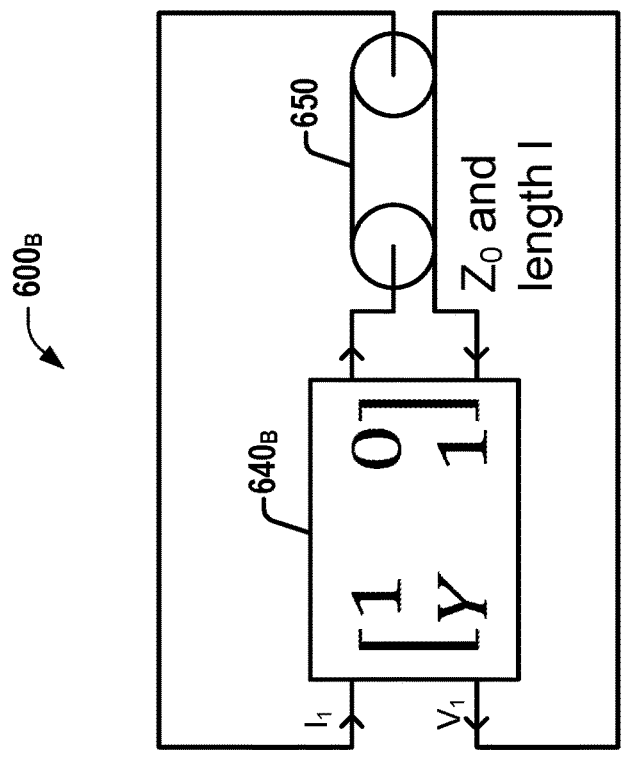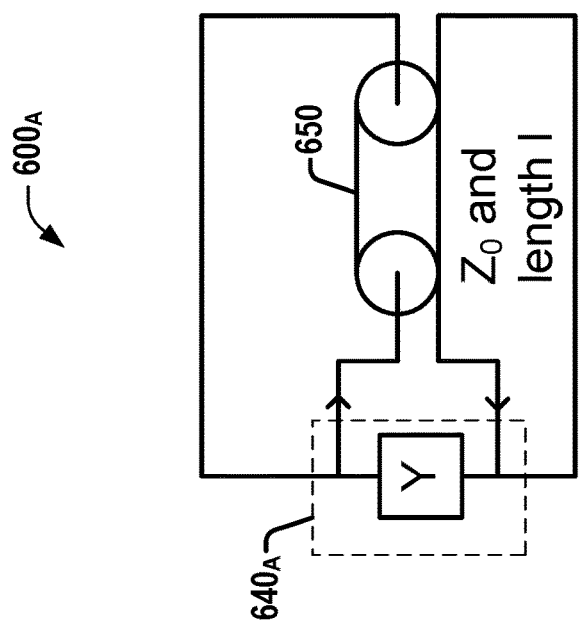
FIG. 6

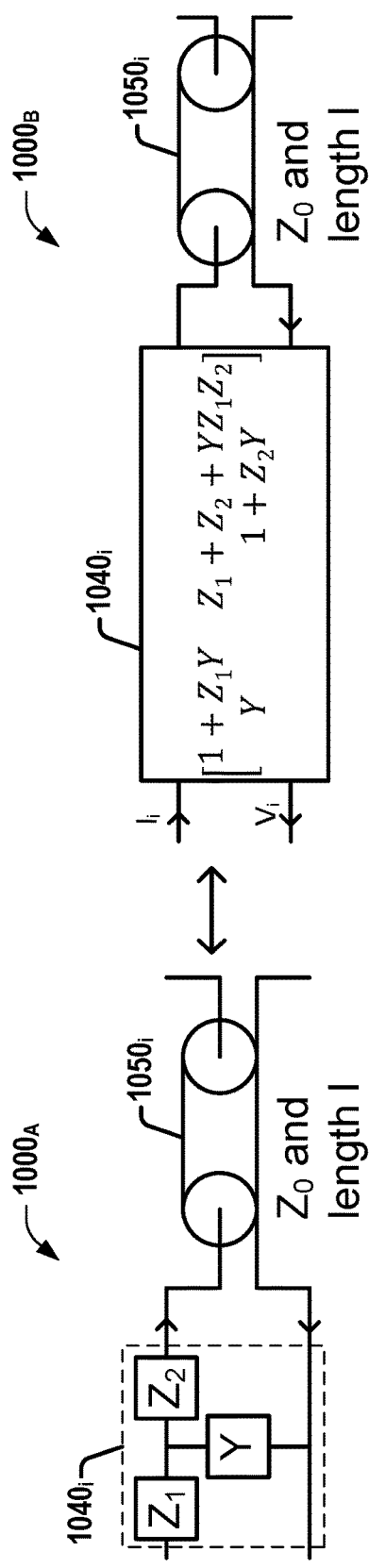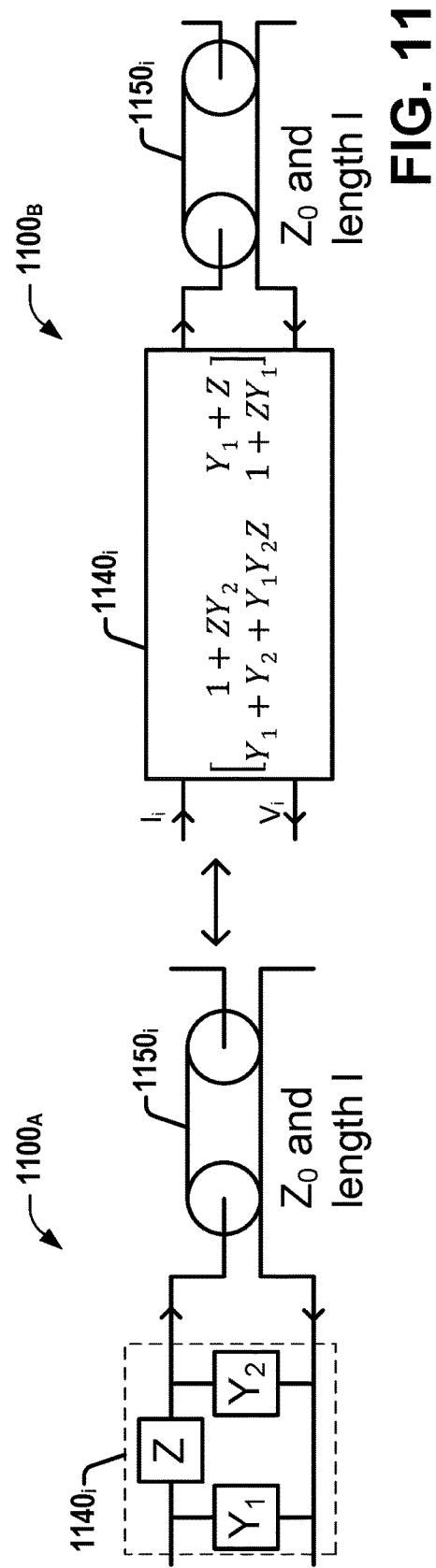

MAGNETIC RESONANCE IMAGING (MRI) COIL USING TRANSMISSION LINES TO ENFORCE PERIODIC CONDITIONS FOR RESONANCE

REFERENCE TO RELATED APPLICATIONS

This application claims the benefit of U.S. Provisional Patent Applications No. 62/758,832 filed Nov. 12, 2018, entitled "MAGNETIC RESONANCE IMAGING (MRI) COIL USING TRANSMISSION LINES TO ENFORCE PERIODICAL CONDITIONS FOR RESONANCE", the contents of which are herein incorporated by reference in their entirety.

BACKGROUND

Magnetic resonance imaging (MRI) involves the transmission and receipt of radio frequency (RF) energy. RF energy may be transmitted by a coil. Resulting magnetic resonance (MR) signals may also be received by a coil. In early MRI, RF energy may have been transmitted from a single coil and resulting MR signals received by a single coil. Later, multiple receivers may have been used in parallel acquisition techniques. Similarly, multiple transmitters may have been used in parallel transmission (pTx) techniques.

RF coils create the $B_1$ field that rotates the net magnetization in a pulse sequence. RF coils may also detect precessing transverse magnetization. Thus, RF coils may be transmit (Tx) coils, receive (Rx) coils, or transmit and receive (Tx/Rx) coils. An imaging coil should be able to resonate at a selected Larmor frequency. Imaging coils include inductive elements and capacitive elements. The inductive elements and capacitive elements have been implemented according to existing approaches using two terminal passive components (e.g., capacitors). The resonant frequency, f, of a RF coil is determined by the inductance (L) and capacitance (C) of the inductor capacitor circuit according to equation (1):

$$f = \frac{1}{2\pi\sqrt{LC}} \quad (1)$$

Imaging coils may need to be tuned. Tuning an imaging coil may include varying the value of a capacitor. Recall that frequency: $f=\omega/(2\pi)$, wavelength in vacuum: $\lambda=c/f$, and $\lambda=4.7$ m at 1.5 T. Recall also that the Larmor frequency: $f_0=\gamma B_0/(2\pi)$, where (for $^1H$ nuclei) $\gamma/(2\pi)=42.58$ MHz/T; at 1.5 T, $f_0=63.87$ MHz; at 3 T, $f_0=127.73$ MHz; at 7 T, $f_0=298.06$ MHz. Basic circuit design principles include the fact that capacitors add in parallel (impedance $1/(jC\omega)$) and inductors add in series (impedance $jL\omega$).

BRIEF DESCRIPTION OF THE DRAWINGS

FIG. 6 is a diagram illustrating a second example embodiment of the resonator of FIG. 4, comprising a shunt, according to various embodiments discussed herein.

FIG. 10 is a pair of diagrams illustrating a circuit diagram and a diagram with ABCD matrix of a resonator comprising T network(s) and transmission line(s), according to various embodiments discussed herein.

FIG. 11 is a pair of diagrams illustrating a circuit diagram and a diagram with ABCD matrix of a resonator comprising π network(s) and transmission line(s), according to various embodiments discussed herein.

DETAILED DESCRIPTION

Figure 1:
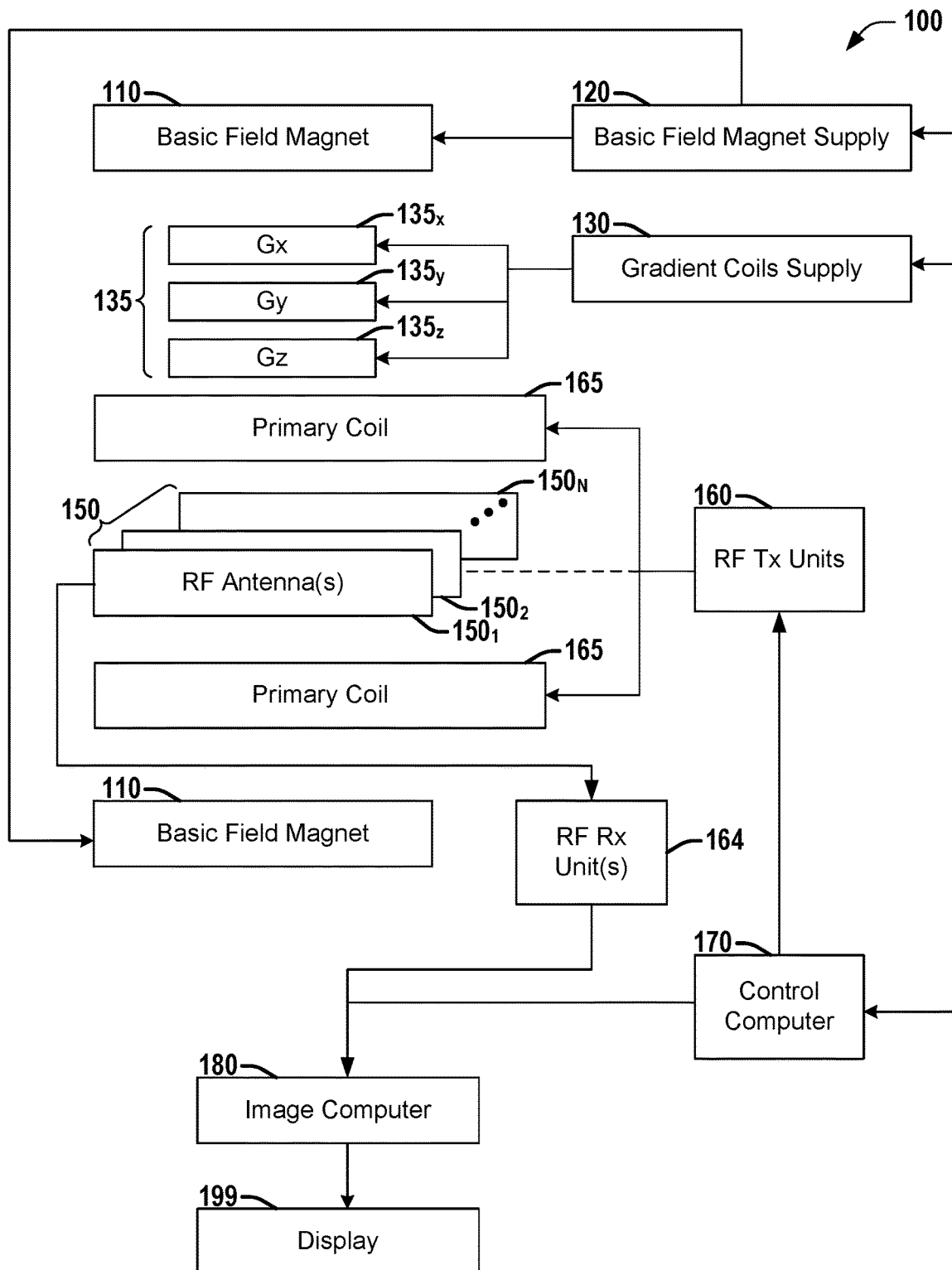
FIG. 1 is a block diagram illustrating an example MRI (Magnetic Resonance Imaging) apparatus that can be configured with example MRI RF (Radio Frequency) coils, coil elements, coil arrays, or circuitry according to one or more embodiments described herein.

The present disclosure will now be described with reference to the attached drawing figures, wherein like reference numerals are used to refer to like elements throughout, and wherein the illustrated structures and devices are not necessarily drawn to scale.

Embodiments described herein can be implemented in a MRI (Magnetic Resonance Imaging) system using any suitably configured hardware and/or software. Referring to FIG. 1, illustrated is an example MRI apparatus 100 that can be configured with example MRI RF coils, coil elements, coil arrays, or circuitry according to one or more embodiments described herein. Apparatus 100 includes basic field magnet(s) 110 and a basic field magnet supply 120. Ideally, the basic field magnets 110 would produce a uniform $B_0$ field. However, in practice, the $B_0$ field may not be uniform, and may vary over an object being imaged by the MRI apparatus 100. MRI apparatus 100 can include gradient coils 135 configured to emit gradient magnetic fields like $G_x$ (e.g., via an associated gradient coil $135_x$), $G_y$ (e.g., via an associated gradient coil $135_y$) and $G_z$ (e.g., via an associated gradient coil $135_z$). The gradient coils 135 can be controlled, at least in part, by a gradient coils supply 130. In some examples, the timing, strength, and orientation of the gradient magnetic fields can be controlled, and thus selectively adapted during a MRI procedure.

MRI apparatus 100 can include a primary coil 165 configured to generate RF pulses. The primary coil 165 can be a whole body coil (WBC). The primary coil 165 can be, for example, a birdcage coil. The primary coil 165 can be controlled, at least in part, by a RF transmission unit 160. RF transmission unit 160 can provide a signal to primary coil 165.

MRI apparatus 100 can include a set of RF antennas 150 (e.g., one or more RF antennas $150_1$-$150_N$, which can be as described herein). RF antennas 150 can be configured to generate RF pulses and/or to receive resulting magnetic resonance signals from an object to which the RF pulses are directed. A RF antenna 150 configured solely to generate RF pulses can be referred to herein as a transmit (or Tx) antenna (or coil or coil array), while a RF antenna 150 configured solely to receive resulting magnetic resonance signals from an object to which the RF pulses are directed can be referred to herein as a receive (or Rx) antenna (or coil or coil array), and a RF antenna 150 configured to both generate RF pulses and receive resulting magnetic resonance signals can be referred to herein as a transmit/receive (or Tx/Rx) antenna (or coil or coil array). Unless otherwise indicated, antennas, coils, and coil arrays discussed herein can, in various embodiments, be any of a Tx antenna/coil/coil array, a Rx antenna/coil/coil array, or a Tx/Rx antenna/coil/coil array.

In some embodiments, RF antennas 150 can be configured to inductively couple with primary coil 165 and generate RF pulses and to receive resulting magnetic resonance signals from an object to which the RF pulses are directed. In other embodiments, RF antennas 150 can be electrically coupled to a power source (e.g., RF Tx unit 160) that can drive RF antennas 150 to generate RF pulses, and RF antennas can also be configured to receive resulting magnetic resonance signals from an object to which the RF pulses are directed. In one embodiment, one or more members of the set of RF antennas 150 can be fabricated from flexible coaxial cable, or other conductive material. The set of RF antennas 150 can be connected with a RF receive unit 164.

The gradient coils supply 130 and the RF transmission units 160 can be controlled, at least in part, by a control computer 170. The magnetic resonance signals received from the set of RF antennas 150 can be employed to generate an image, and thus can be subject to a transformation process like a two dimensional fast Fourier transform (FFT) that generates pixilated image data. The transformation can be performed by an image computer 180 or other similar processing device. The image data can then be shown on a display 199. RF Rx Units 164 can be connected with control computer 170 or image computer 180. While FIG. 1 illustrates an example MRI apparatus 100 that includes various components connected in various ways, it is to be appreciated that other MRI apparatus can include other components connected in other ways, and can be employed in connection with various embodiments discussed herein.

In one embodiment, MRI apparatus 100 includes control computer 170. In one example, a member of the set of RF antennas 150 can be individually controllable by the control computer 170. A member of the set of RF antennas 150 can be an example MRI RF coil array including, for example, MRI RF coil arrays as described herein. In various embodiments, the set of RF antennas 150 can include various combinations of example embodiments of MRI RF coil arrays, elements or example embodiments of MRF RF coil arrays, including single-layer MRI RF coil elements or single-layer MRI RF coil arrays, according to various embodiments described herein.

A MRI apparatus can include, among other components, a controller (e.g., control computer 170) and a RF coil (e.g., primary coil 165) operably connected to the controller. The controller can provide the RF coil with a current, a voltage, or a control signal. The coil can be a whole body coil. The coil can inductively couple with an example MRI RF coil element, or MRI RF coil array, as described herein. Control computer 170 can provide a DC bias current, or control a DC bias control circuit to control the application of a DC bias current to MRI RF coil arrays or elements that can be part of antennas 150.

Figure 2:
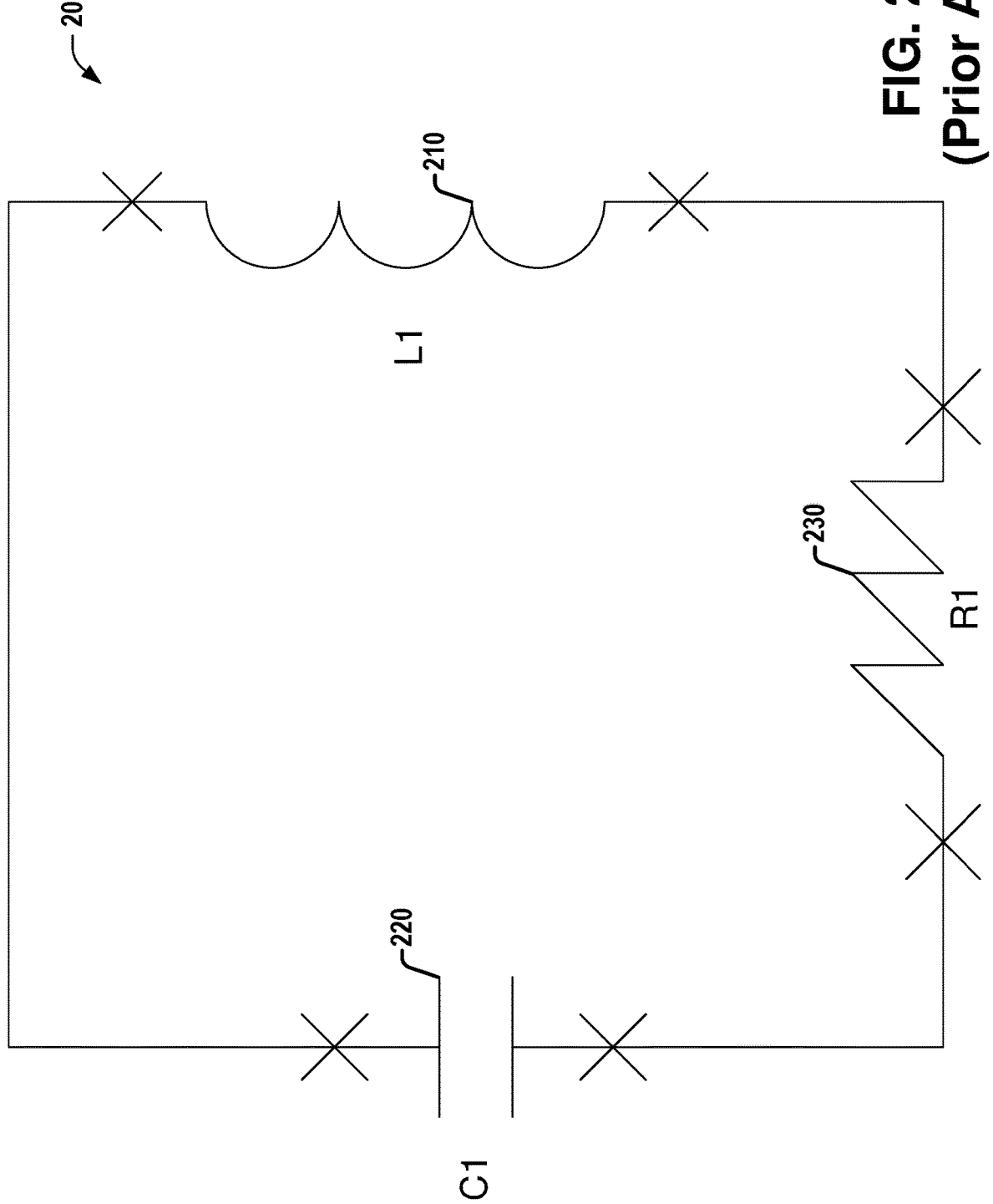
FIG. 2 is a diagram illustrating a first existing type of MRI coil, in connection with various aspects discussed herein.
Figure 3:
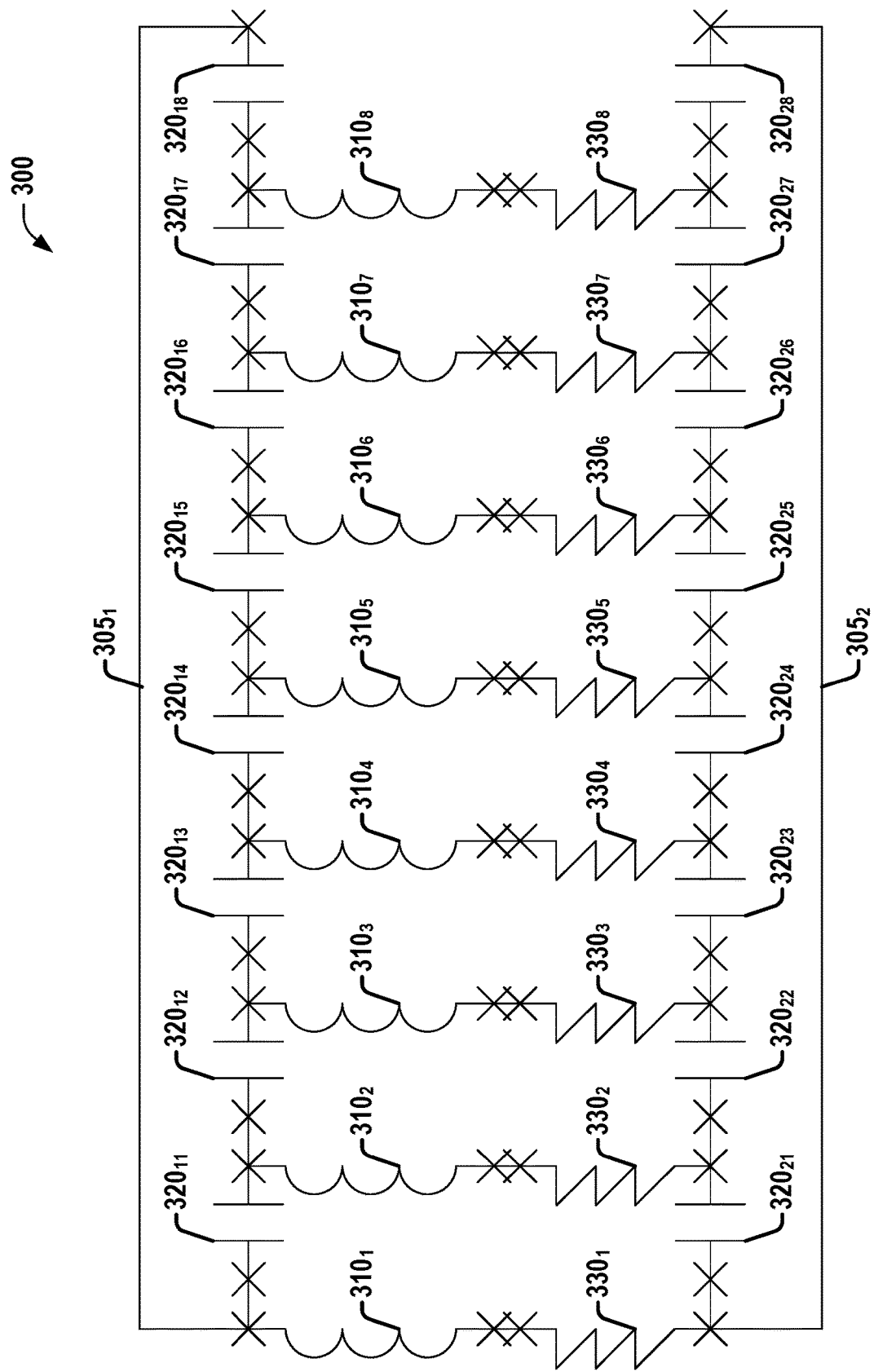
FIG. 3 is a diagram illustrating an example 8-rung high pass birdcage MRI coil, in connection with various aspects discussed herein.

A magnetic resonance imaging (MRI) coil can be used as a signal sensor to detect MRI signals from a subject, or as a transmitter to apply a $B_1$ field to excite the spins of nuclei of the subject. A MRI coil can comprise inductors and capacitors, and can have resistive loss related to copper, capacitor(s), radiation, and eddy currents from the subject being imaged. Two kinds of MR coils have been used in existing systems. Referring to FIG. 2, illustrated is a diagram showing a first existing type of MRI coil 200, in connection with various aspects discussed herein. In MRI coil 200 of FIG. 2, L1 represents the coil inductance 210, C1 represents the coil capacitance 220, and R1 represents the coil resistive loss 230. Existing loop or saddle coils can be configured according to the circuit illustrated by FIG. 2. A second existing type of MR coil is a birdcage style coil. Referring to FIG. 3, illustrated is a diagram showing an example 8-rung high pass birdcage MRI coil 300, in connection with various aspects discussed herein. Birdcage coil 300 comprises two loops $305_i$ comprising associated capacitors $320_{ij}$ connected by eight rungs, each comprising an associated inductor $310_j$ and resistor $330_j$. In contrast to these two types of existing MR coils, various embodiments can comprise and/or employ a distinct kind of MR coil discussed herein, that uses transmission lines to enforce periodic conditions for resonance.

Figure 4:
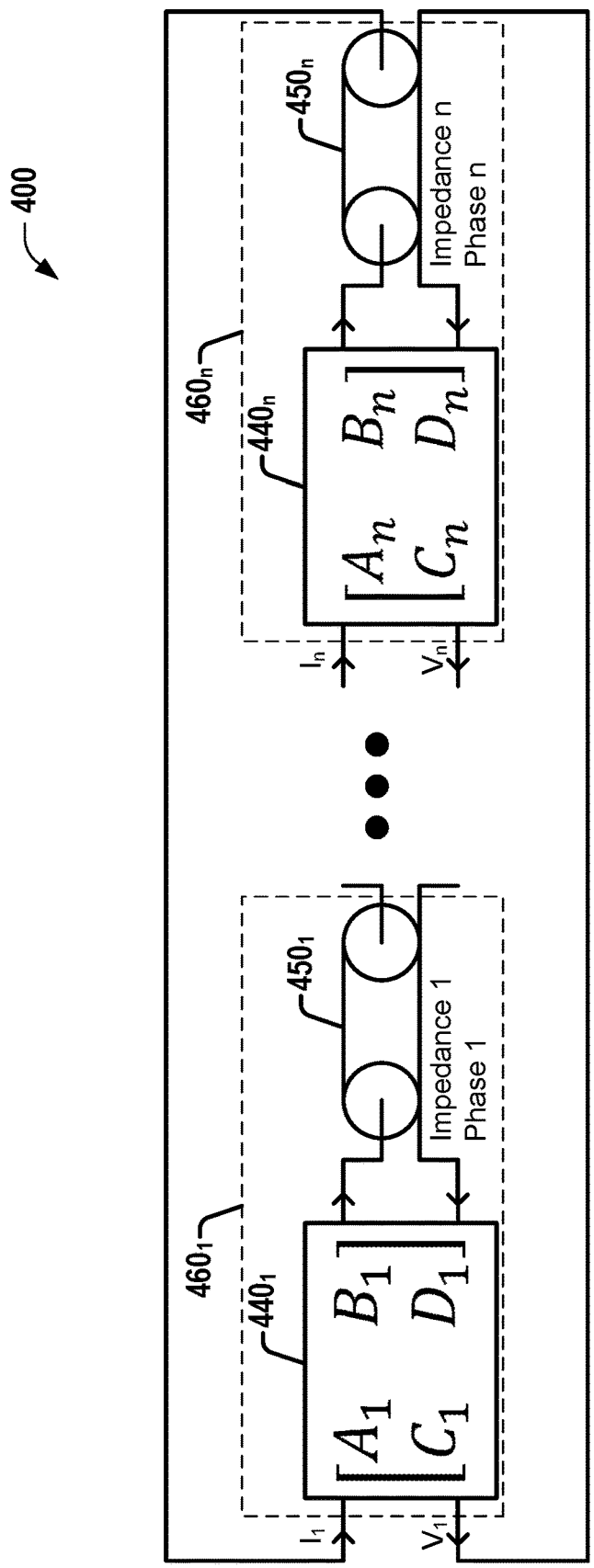
FIG. 4 is a diagram illustrating an example resonator employing transmission lines for resonance that can be employed as a MR coil in various embodiments, according to various aspects discussed herein.

Referring to FIG. 4, illustrated is a diagram showing an example resonator 400 employing transmission lines for resonance that can be employed as a MR coil in various embodiments, according to various aspects discussed herein. Various embodiments can employ one or more resonators such as resonator 400 as transmit (Tx) and/or receive (Rx) coil(s), and can (depending on the embodiment) employ a single such resonator or multiple such resonators in a multi-array coil. FIG. 4 shows the general configuration of a resonator 400 using transmission lines $450_i$ for resonance, wherein specific examples can be employed in various embodiments. Example resonator 400 comprises n sections of one two-port device $440_i$ and one transmission line $450_i$, with the n sections connected in a loop or circle. Each of the n sections can be considered a single assembly $460_i$, wherein each assembly $460_i$ comprises one two-port device $440_i$ and one transmission line $450_i$, in the same order as in other assemblies $460_i$ of resonator 400, and wherein each of the two-port devices $440_i$ are similar to each other, and each of the transmission lines $450_i$ are similar to each other (additionally, although each pairing of two-port device and transmission line is also an assembly in the examples of FIGS. 5-12 discussed below, for ease of illustration, it is only specifically indicated on FIG. 4, which shows the more general case). The starting point of the first section of resonator 400 (left side of $440_1$) joins the ending point of the last (nth) section of resonator 400 (the right side of $450_n$). The electric and magnetic signal can travel from one section (e.g., $440_i$ with its associated $450_i$) to its neighbor section (e.g., $440_{i+1}$ with its associated $450_{i+1}$) and so on. Since all of the sections (e.g., $440_i$ with its associated $450_i$, for i=1 to n) are connected in resonator 400 to form a loop, a periodic condition applies, wherein the signal that travels from section 1 to section n and comes back to section 1 must be same as before. This periodic condition creates a collective resonance among all connected two-port devices $440_i$. In various embodiments, two-port devices $440_i$ can comprise any two-port device (including, but not limited to examples discussed herein), as the periodic condition results from the symmetry of each of the n two-port devices $440_i$ being similar (e.g., and separated by similar transmission lines $450_i$), independent of the substructure comprised within those two-port devices $440_i$. Additionally, some embodiments of resonator 400 can comprise collections of individual distinct two-port devices that occur in repeating groups, wherein each of those groups can be considered as one of the similar two-port devices $440_i$ of resonator 400 (e.g., wherein a first two-port device $440_1$ comprises distinct individual two-port devices (which may or may not be separated by transmission lines, which may or may not have the same length) which, taken as a whole, can be described by $A_1$, $B_1$, $C_1$, and $D_1$; a second two-port device $440_2$ comprises distinct individual two-port devices (e.g., that are arranged similarly (e.g., separated by similar length(s) of transmission lines if applicable, etc.) to those of the first two-port device $440_1$ described by $A_1$, $B_1$, $C_1$, and $D_1$; etc.), wherein the second two-port device $440_2$ can be described by $A_2$ (which is similar to $A_1$), $B_2$ (which is similar to $B_1$), $C_2$ (which is similar to $C_1$), and $D_2$ (which is similar to $D_1$). Additionally, although different two-port devices $440_i$ of a given embodiment may be referred to herein as similar, the same, identical, etc., it is to be understood that minor variations can exist between two-port devices $440_i$ of the same resonator 400 such that the symmetry and resulting techniques still apply to sufficient degree for practical MRI applications (e.g., Tx and/or Rx operation at any of a variety of field strengths). These minor variations can include unintended variations (e.g., production variations of components, minor variations in lengths of transmission lines $450_i$, etc.) and/or intended variations (e.g., as a result of separately tuning individual coils of different two-port devices $440_i$, etc.).

In various aspects, embodiments discussed herein (e.g., comprising or employing variations on resonator 400) can facilitate conversion of an array receiving coil to a transmitter coil without using a system whole body coil or another layer of local transmitter coil as a transmitter coil in a transmitting mode. The conversion can be realized by using coax cables (e.g., $450_i$) to connect coil elements (e.g., $440_i$) together. In various embodiments, all or part of the two-port device (e.g., $440_i$) in each section can be a coil element in an array coil. Since such embodiments need not employ the whole body coil or another layer of local transmitter coil in a transmit mode, the coil can use significantly less Tx RF (Radio Frequency) power, have less SAR (Specific Absorption Rate), and have a sleeker and more compact design that can have more openings for a less claustrophobic coil design. Various embodiments can also omit decoupling circuits that are present in existing array receiving coils, which can improve the coil signal to noise ratio. Various embodiments can be employed in a variety of MRI systems, ranging from very low field systems to very high field systems, such as >7 T.

A two-port device (e.g., $440_i$) can be described by an ABCD matrix. A two-port device (e.g., $440_i$) can comprise one or more of capacitors, inductors, or antennas. An inductor/antenna can create a magnetic field/radiation field if current is flowing through it, and can thereby operate as MR coils/antennas that create a magnetic field/radiation field to excite the spin of nuclei in a subject, or detect MR signal(s) for MR imaging. Thus, for embodiments of resonator 400 comprising at least one inductor/antenna, the whole assembly at resonance can be used as a MRI coil. Embodiments described herein that employ transmission lines for resonance, such as MRI coil 400, can be described mathematically by equation (2), below:

$$\begin{pmatrix} V_i \\ I_i \end{pmatrix} = \begin{bmatrix} A_i & B_i \\ C_i & D_i \end{bmatrix} \begin{bmatrix} \cosh(\gamma_i * l_i) & Z_i \sinh(\gamma_i * l_i) \\ \left(\frac{1}{Z_i}\right) \sinh(\gamma_i * l_i) & \cosh(\gamma_i * l_i) \end{bmatrix} \begin{pmatrix} V_{i+1} \\ I_{i+1} \end{pmatrix}, \quad (2)$$

where $V_i$ and $I_i$ are the voltage and current at the ith section per definition of ABCD matrix. $A_i B_i C_i D_i$ is the ABCD matrix that describes the two-port device at the ith section (e.g., $440_i$). In various embodiments, the two-port device (e.g., $440_i$) can comprise the inductors and capacitors to generate a MR field for MR imaging. The length of the transmission line at the h section (e.g., $450_i$) is $l_i$, the intrinsic impedance of the transmission line is $Z_i$ at the section, and the propagation constant is $\gamma_i$ for the transmission line at the section. The $\gamma$ is defined as $\alpha+j\beta$, where $\alpha$ is the unit length attenuation constant and $$\beta = \frac{\omega\sqrt{\varepsilon}}{c},$$

where $\omega$ is the angular frequency, $\varepsilon$ is the equivalent dielectric constant of the transmission line and c is the speed of the light. The subscript i ranges from 1 to n and $V_1=V_n$ and $I_1=I_n$ for the periodic condition. For the lossless case, equation (2) becomes equation (3):

$$\begin{pmatrix} V_i \\ I_i \end{pmatrix} = \begin{bmatrix} A_i & B_i \\ C_i & D_i \end{bmatrix} \begin{bmatrix} \cos(\beta_i * l_i) & jZ_i \sin(\beta_i * l_i) \\ j\left(\frac{1}{Z_i}\right) \sin(\beta_i * l_i) & \cos(\beta_i * l_i) \end{bmatrix} \begin{pmatrix} V_{i+1} \\ I_{i+1} \end{pmatrix} \quad (3)$$

Figure 5:
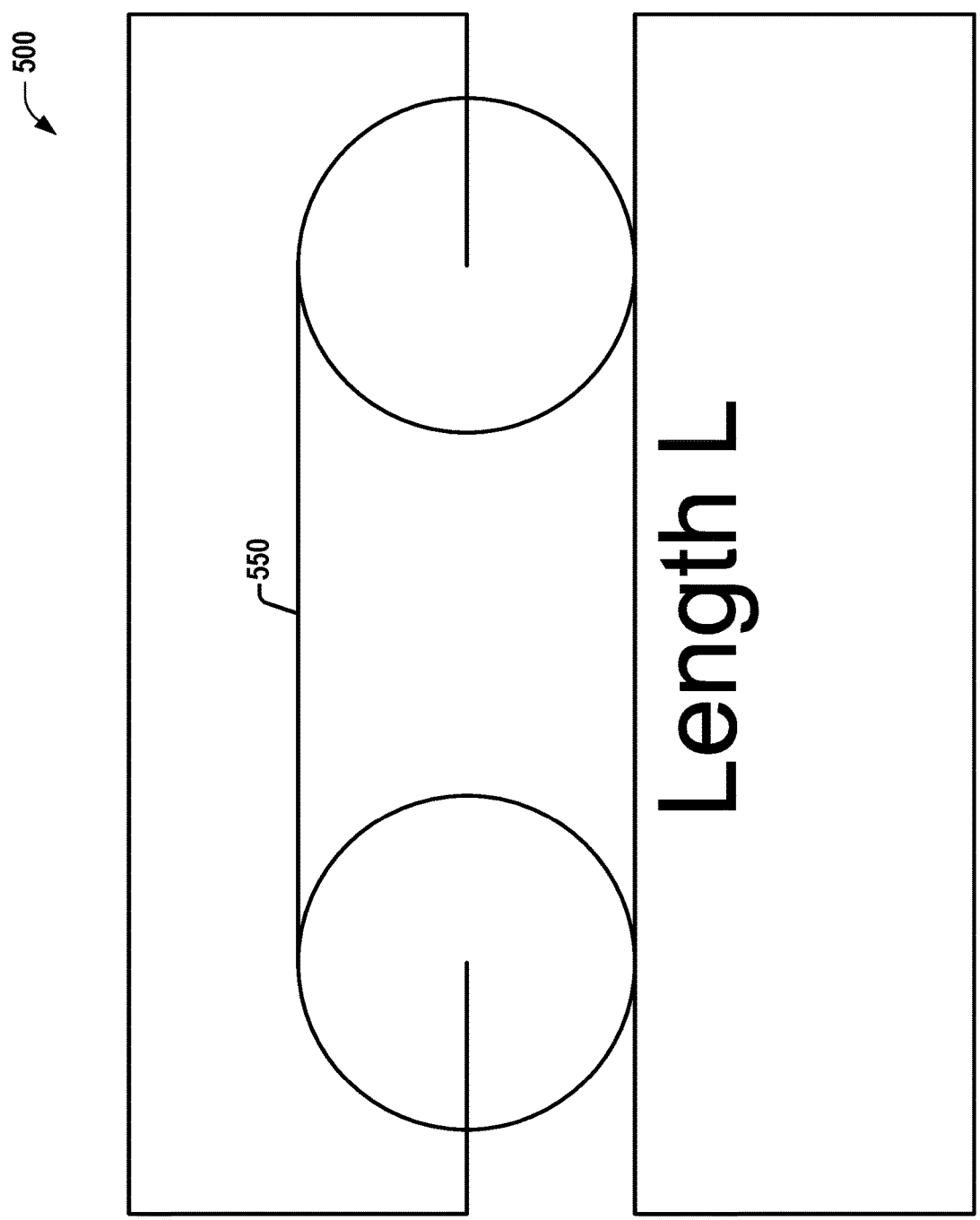
FIG. 5 is a diagram illustrating a first example MRI coil as the simplest example of the resonator of FIG. 4, according to various embodiments discussed herein.

To demonstrate how various embodiments (e.g., variations of resonator 400) can operate, the following illustrative examples are provided. The first example is the simplest one, in which n=1 and the ABCD matrix is a unity matrix. Referring to FIG. 5, illustrated is a diagram showing example MRI coil 500 as the simplest example of the resonator 400 of FIG. 4, according to various embodiments discussed herein. Example MRI coil 500 comprises one section of transmission line 550. Since the starting point and the ending point are same, then the ABCD matrix for the transmission line must be the unity matrix too. Therefore, the resonance condition is expressed in equation (4):

$$\cos((\beta l)=1 \text{ or } \sin(\beta l)=0 \quad (4)$$

As a result, in example 500 of FIG. 5, the length of the transmission line is an integer multiple of 360 degrees at the resonant frequency, or equivalently, per equation (5):

$$f = N * \frac{c}{l * \sqrt{\varepsilon}}, \quad (5)$$

where N is a positive integer. N=1 gives the lowest resonant frequency of this example resonator. For this simplest case of a single connected loop of transmission line, the resonator is not suitable for clinical MRI coil applications because magnetic field is confined within the transmission line, and thus does not interact with the scanned subject.

Referring to FIG. 6, illustrated is a second example embodiment of resonator 400 that is slightly more complex than that of FIG. 5, according to various embodiments discussed herein. FIG. 6 illustrates a transmission line 650 with a shunt admittance 640$_A$ as an example two-port device, showing the circuit diagram 600$_A$ and diagram 600$_B$ with the corresponding ABCD matrix 640$_B$ for shunt admittance 640$_A$. The shunt 640$_A$ can be any of a capacitor, an inductor, a capacitor and inductor in parallel or serial, more capacitors and inductors in some combination, and/or an antenna or antenna combination. For simplicity, transmission line 650 can be assumed to be lossless. Based on FIG. 6, equation (3), and the periodic condition, equation (6) can be obtained:

$$\begin{pmatrix} V_1 \\ I_1 \end{pmatrix} = \begin{bmatrix} 1 & 0 \\ Y & 1 \end{bmatrix} \begin{bmatrix} \cos(\beta*l) & jZ_0*\sin(\beta*l) \\ j\frac{1}{Z_0}\sin(\beta*l) & \cos(\beta*l) \end{bmatrix} \begin{pmatrix} V_1 \\ I_1 \end{pmatrix}, \quad (6)$$

which gives equation (7):

$$\begin{pmatrix} V_1 \\ I_1 \end{pmatrix} = \begin{bmatrix} \cos(\beta*l) & jZ_0*\sin(\beta*l) \\ Y*\cos(\beta*l) + j\frac{1}{Z_0}\sin(\beta*l) & Y*jZ_0*\sin(\beta*l) + \cos(\beta*l) \end{bmatrix} \begin{pmatrix} V_1 \\ I_1 \end{pmatrix} \quad (7)$$

Solving equation (7) gives equation (8):

$$\tan\left(\frac{\omega\sqrt{\varepsilon}*l}{2*c}\right) = \frac{1}{2} j*Y*Z_0 \quad (8)$$

The frequency solution to equation (8) with a predefined Y and $Z_0$ can be the resonant frequencies of the resonator of FIG. 6, which can have many solutions. Furthermore, if Y is a combination of inductors and capacitors, then the solution can be more complicated. If Y includes an inductor and the inductor generates $B_1$ field, then this resonator can be used as a MRI coil (e.g., as a RF antenna 150 in MRI apparatus 100, etc.).

Figure 7:
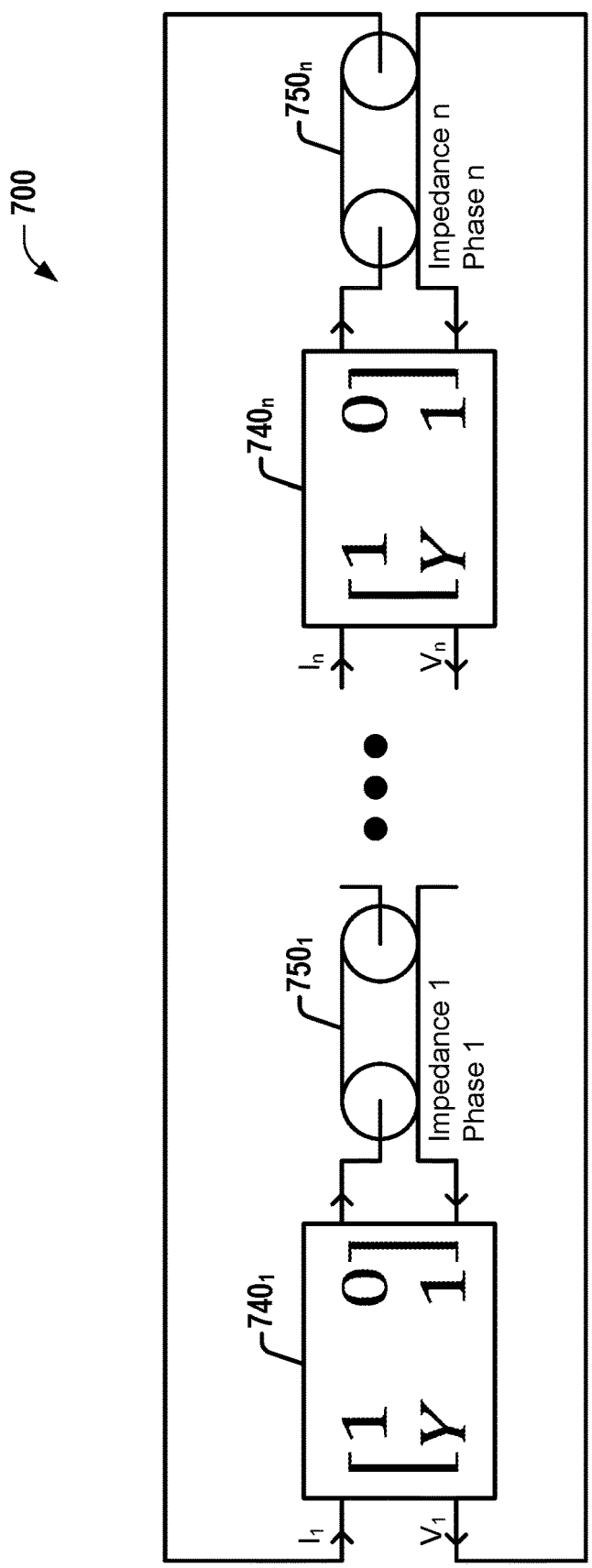
FIG. 7 is a diagram illustrating a third example embodiment of the resonator of FIG. 4, comprising n identical shunts, according to various embodiments discussed herein.

Referring to FIG. 7, illustrated is a third example embodiment 700 of resonator 400 that is slightly more complex than that of FIG. 6, according to various embodiments discussed herein. Instead of a single Y shunt and transmission line assembly as in FIG. 6, resonator 700 comprises n sections of identical shunt 740$_i$ (represented via its ABCD matrix in FIG. 7) and transmission line 750$_i$ assemblies. Resonator 700 can be described by equation (9):

$$\begin{pmatrix} V_1 \\ I_1 \end{pmatrix} = \begin{bmatrix} \cos(\beta*l) & jZ_0*\sin(\beta*l) \\ Y*\cos(\beta*l) + j\frac{1}{Z_0}\sin(\beta*l) & Y*jZ_0*\sin(\beta*l) + \cos(\beta*l) \end{bmatrix}^n \begin{pmatrix} V_1 \\ I_1 \end{pmatrix} \quad (9)$$

Based on symmetry, it can be determined that the relationship between the ith and (1+1) assemblies V and I can be written as in equation (10):

$$\begin{pmatrix} V_i e^{i\frac{2\pi m}{n}} \\ I_i e^{i\frac{2\pi m}{n}} \end{pmatrix} = \begin{bmatrix} \cos(\beta*l) & jZ_0*\sin(\beta*l) \\ Y*\cos(\beta*l) + j\frac{1}{Z_0}\sin(\beta*l) & Y*jZ_0*\sin(\beta*l) + \cos(\beta*l) \end{bmatrix}^n \begin{pmatrix} V_i \\ I_i \end{pmatrix} \quad (10)$$

where m is an integer ranging from 1 to n. When m is greater than n, the phase value just repeats.

The solution to equation (10) can be written as in equation (11):

$$jYZ_0 \sin\left(\frac{\omega\sqrt{\varepsilon}*l}{c}\right) + 2\cos\left(\frac{\omega\sqrt{\varepsilon}*l}{c}\right) = 2\cos\left(\frac{2\pi m}{n}\right) \quad (11)$$

Figure 8:
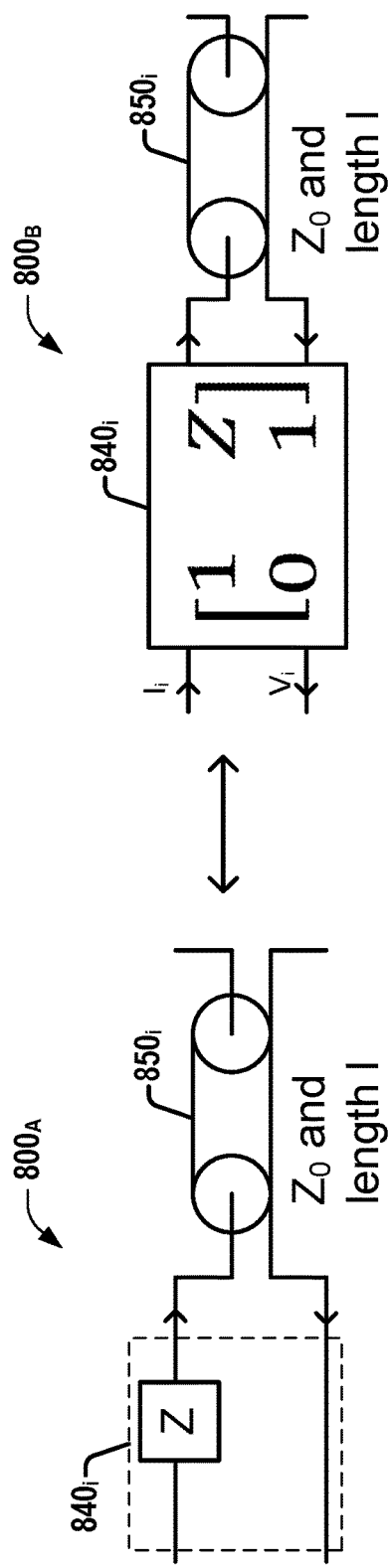
FIG. 8 is a pair of diagrams illustrating a circuit diagram and a diagram with ABCD matrix of a resonator comprising serial impedance(s) and transmission line(s), according to various embodiments discussed herein.
Figure 9:
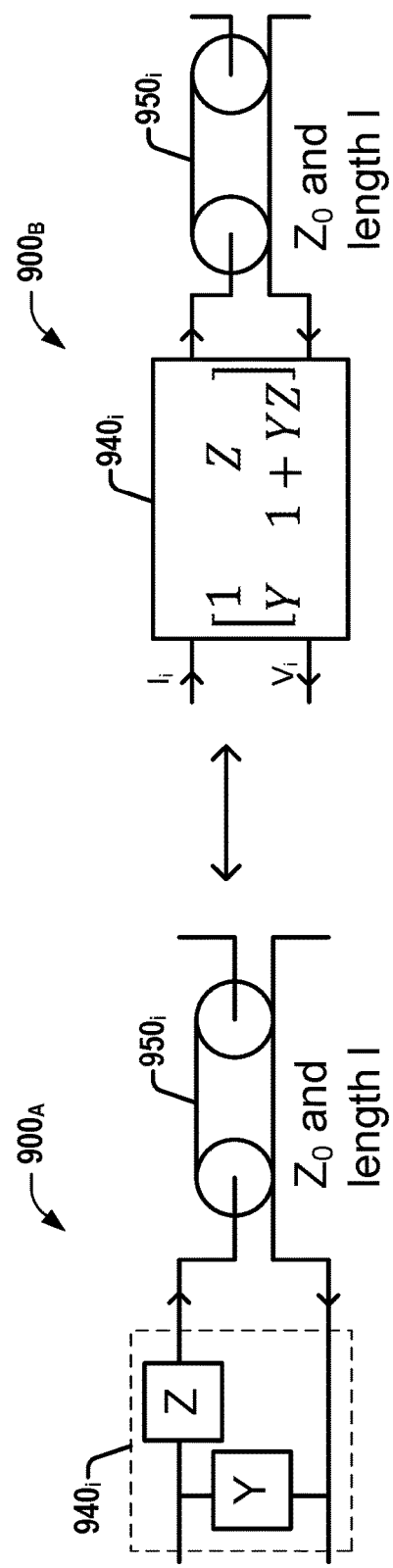
FIG. 9 is a pair of diagrams illustrating a circuit diagram and a diagram with ABCD matrix of a resonator comprising L network(s) and transmission line(s), according to various embodiments discussed herein.

For given transmission lines the frequency solutions to Eq. 9 give the resonant frequencies of the resonator. The phase distribution for m=1 is often the uniform mode distribution if the physical distribution of each Y (e.g., of FIG. 7) is cylindrical and symmetrical. Instead of shunt Y, in various embodiments, any of a variety of other configurations of resonators can be employed with varying two-port devices, including but not limited to the following example embodiments. Referring to FIG. 8, illustrated is a circuit diagram 800$_A$ and diagram 800$_B$ with ABCD matrix of a resonator comprising serial impedance(s) 840$_i$ and transmission line(s) 850$_i$, according to various embodiments discussed herein. Referring to FIG. 9, illustrated is a circuit diagram 900$_A$ and diagram 900$_B$ with ABCD matrix of a resonator comprising L network(s) 940$_i$ and transmission line(s) 950$_i$, according to various embodiments discussed herein. Referring to FIG. 10, illustrated is a circuit diagram 1000$_A$ and diagram 1000$_B$ with ABCD matrix of a resonator comprising T network(s) 1040$_i$ and transmission line(s) 1050$_i$, according to various embodiments discussed herein. Referring to FIG. 11, illustrated is a circuit diagram 1100$_A$ and diagram 1100$_B$ with ABCD matrix of a resonator comprising π network(s) 1140$_i$ and transmission line(s) 1150$_i$, according to various embodiments discussed herein. In any of a variety of embodiments, the two-port networks (e.g., 440$_i$, 740$_i$, 840$_i$, 940$_i$, 1040$_i$, 1140$_i$, 1240$_i$, etc.) can be connected by multiple transmission lines in a circle or loop (e.g., wherein 440$_i$ (etc.) is connected between 450$_{i-1}$ and 450$_i$ for 1<i≤n, and 440$_i$ is connected between 450$_n$ and 450$_i$). This configuration creates resonances among all of these two-port networks (e.g., 440$_i$, etc.). If these networks (e.g., 440$_i$, etc.) comprise inductors and antennas which can be used to generate a $B_1$ field, then the currents through the inductors and antennas can be manipulated in magnitude and phase through the resonances. This configuration can create a "jumbo" RF resonant coil such that each two-port device (e.g., 440$_i$, etc.) in the network is part of the "jumbo" coil. The transmitter and receiver $B_1$ field from this "jumbo" coil can be adjusted through different Y, Z, and transmission line selection for different applications, such as a uniform $B_1$ field application.

Figure 12:
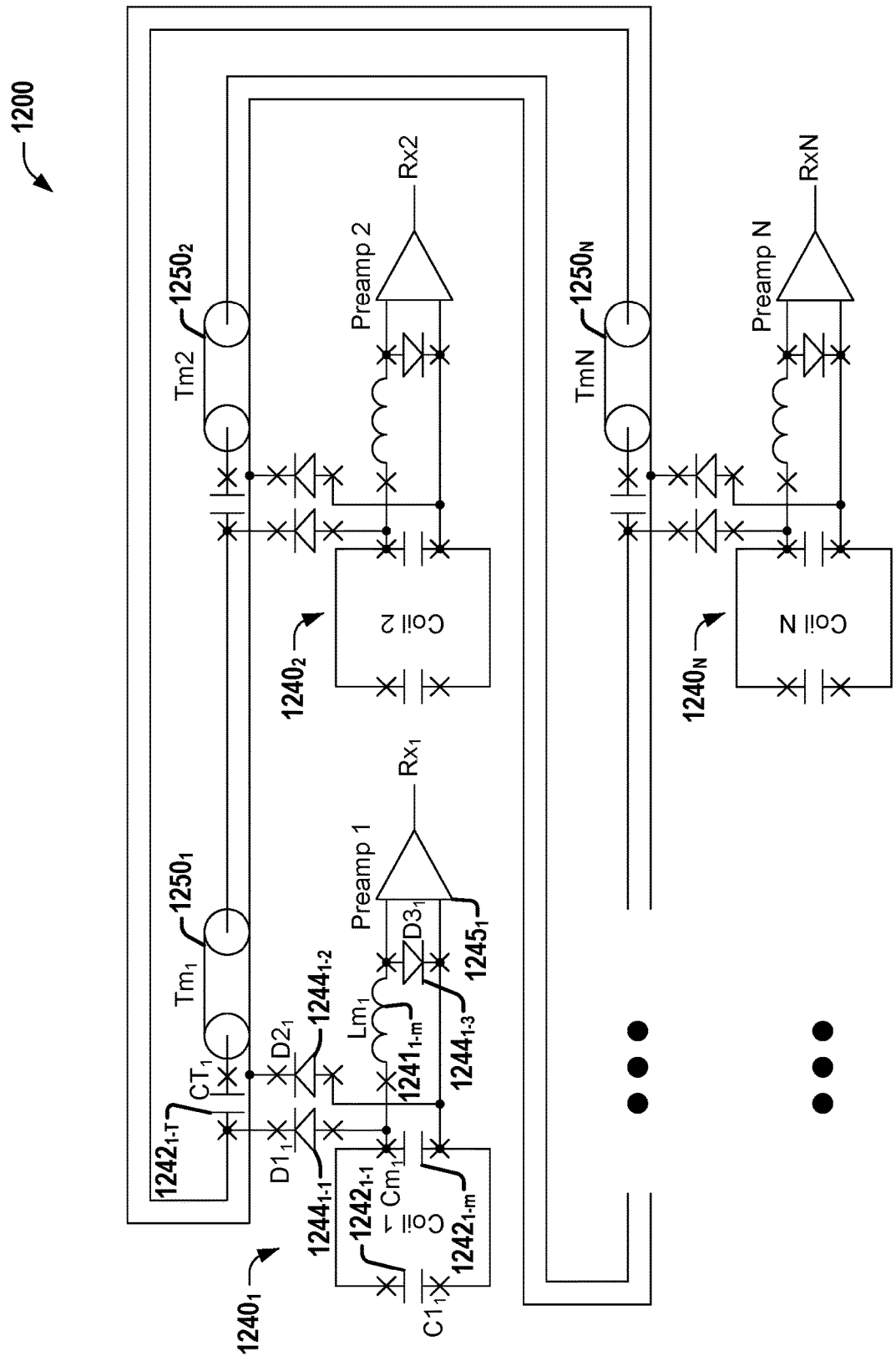
FIG. 12 is a diagram illustrating a resonator as one example transmit set that can be employed as or within a MRI coil of a MRI apparatus, according to various embodiments discussed herein.

One application of the resonator (e.g., 400, etc.) discussed herein and employable in various embodiments is a single layer of coils employable alternately in a Tx mode or a Rx mode as a parallel transmission (pTx) and array Rx coil and/or as a "jumbo" Tx coil with each coil resonating together. Referring to FIG. 12, illustrated is a diagram showing a resonator 1200 as one example transmit set that can be employed as or within (e.g., as one row of multiple parallel rows of an array, etc.) a MRI coil (e.g., RF antenna 150) of a MRI apparatus (e.g., MRI apparatus 100), according to various embodiments discussed herein. Although FIG. 12 shows a diagram of a single Tx set employable in both a Tx and Rx mode, in other embodiments, multiple such sets (e.g., which can be similar or different) can be employed (e.g., as rows of a coil array) as a MRI coil (e.g., RF antenna 150).

Similar to FIG. 9, example resonator 1200 uses L networks 1240$_i$ (comprising capacitor 1242$_{i-T}$ (CT$_i$) similar to the Z of 940$_i$ and coil i similar to the Y of 940$_i$) with transmission lines 1250$_i$. In various other embodiments, similar configurations to resonator 1200 can be employed as two-port networks instead of example L networks 1240$_i$, such as those using shunt (e.g., similar to FIG. 7), serial impedance (e.g., similar to FIG. 8), etc. (e.g., similar to FIGS. 9, 10, combinations of embodiments, or other variations discussed herein). In example resonator 1200, diodes 1244$_{1-1}$ (D1), 1244$_{1-2}$ (D2), and 1244$_{1-3}$ (D3) in coil 1 of 1240$_i$ (and similarly in coils 2 through N) are PIN diodes (in other embodiments, other types of switches can be employed, etc.).

In Rx mode, all PIN diodes (e.g., or other switches) can be OFF (e.g., open), and all transmission lines 1250$_i$ can be disconnected from the coils of 1240$_i$. In example resonator 1200, all coils of 1240$_i$ are standard array coils which comprise a matching capacitor 1242$_{i-m}$ (e.g., Cm 1242$_{1-m}$ in coil 1 of 1240$_1$) and a matching inductor Lm 1241$_{i-m}$ (e.g., Lm 1242$_{1-m}$ in coil 1) and a preamplifier 1245$_i$ (e.g., which can be a LNA (Low Noise Amplifier), etc.).

In Tx mode, all PIN diodes (e.g., or other switches) can be ON (e.g., short). When short, PIN diode 1244$_{i-3}$ D3 (e.g., or other switch, etc.) in coil i of 1240$_i$ causes Cm 1242$_{i-m}$ and Lm 1241$_{i-m}$ to resonate with each other, and also protects preamp 1245$_i$ from the high Tx power. As a result, there is a high impedance across the resonant circuit comprising Cm 1242$_{i-m}$ and Lm 1241$_{i-m}$. Because PIN diodes 1244$_{i-1}$ D1 and 1244$_{i-2}$ D2 are also ON, this causes coil i of 1240$_i$ being connected to Tm1 assembly area as a shunt. Together with capacitor 1242$_{i-T}$ CTi, this creates a L network with a transmission line assembly. The L network includes the coil i of 1240$_i$ as shunt and capacitor 1242$_{i-T}$ CTi as serial impedance. The high impedance from Cm 1242$_{i-m}$ and Lm 1241$_{i-m}$ makes them irrelevant. Since all coils in the set are connected like this and connected as a circle, all coils of 1240$_i$ resonate together as one Tx coil to provide a Tx B$_1$ field. The magnitude and phase of each coil are determined by the tuning of the L network(s) 1240$_i$ and lengths of transmission line(s) 1250$_i$. The capacitors 1242$_{i-T}$ CTi provide for independent tuning of the Tx coil.

Coil embodiments such as resonator 1200 (e.g., or employing coils in other arrangements, such as a shunt, serial impedance, T network, π network, or other network, such as a combination thereof, etc.) have the advantage of having a Tx coil for the set without an additional layer Tx coil (e.g., without separate layers for Tx and Rx coils). Various embodiments can be generated by replacing one or more of the Y(s) and/or Z(s) of resonators discussed herein (e.g., or corresponding elements of other two-port devices discussed herein) with a coil. Various embodiments can be used in connection with a variety of different anatomies. For example, head, knee, and wrist are common anatomies for MRI applications. Coil shapes for each of these anatomies are mostly cylindrical and employ a uniform B$_1$ field in Tx. For this application, embodiments discussed herein can employ one Tx coil, in contrast to existing pTx systems. In existing systems, another birdcage-like Tx coil is built outside the Rx array coils. This makes existing coils much bulkier and reduces the coil opening size, which can create a more claustrophobic situation for patients. In contrast, embodiments according to aspects discussed herein employ transmission lines (e.g., 450$_i$, 1250$_i$, etc.) to connect all the coils in one row or multiple rows together, and can tune the resulting "jumbo" coil in a Tx mode.

For anatomies employing cylindrical coils, the current flows in each coil in Tx mode can be tuned to achieve the same or a similar current distribution as a birdcage coil current distribution (e.g., via tuning individual elements 440$_i$-1240$_i$ in parallel (e.g., via tuning capacitor(s) 1242$_{i-T}$ or similar tuning elements), or together via one or more additional elements for tuning (e.g., a tuning assembly, etc.), etc.). Via tuning, the resonator (e.g., 400-1200) can generate a uniform Tx B$_1$ field.

For other anatomies, such as spine, a flat coil can be employed. In various embodiments, a flat Tx coil can be employed (e.g., for spine, etc.) by using an additional Tx loop-saddle pair based on an embodiment such as resonator 400-1200 to create a circular polarized field. Based on example embodiments discussed herein and such techniques, transmission lines (e.g., 450$_i$-1250$_i$) can be employed to ensure that the pattern of the current flowing in each coil has the same or a similar current pattern as that of an existing loop-saddle pair.

Examples herein can include subject matter such as a method, means for performing acts or blocks of the method, at least one machine-readable medium including executable instructions that, when performed by a machine (e.g., MRI machine, for example as described herein, etc.) cause the machine to perform acts of the method or of an apparatus or system according to embodiments and examples described.

A first example embodiment comprises a magnetic resonance imaging (MRI) radio frequency (RF) coil comprising: a plurality of assemblies, wherein each assembly comprises: a two-port device of that assembly, wherein each two-port device contains at least one inductor (coil or antenna) that can create magnetic field/radiation field suitable for MRI B$_1$ field; and a transmission line of that assembly, wherein each transmission line connects two two-port devices, and wherein the whole two-port devices and the transmission lines are connected via connections to create a continuous circle.

A second example embodiment comprises the first example embodiment, wherein each of the two-port devices is one of a shunt, a serial impedance, a L network, a T network, or a π network.

A third example embodiment comprises the first example embodiment, wherein each of the connections can be controlled by a Tx/Rx switch, wherein each of the connections are ON in a Tx mode and each of the connections are OFF in a Rx mode.

A fourth example embodiment comprises the third example embodiment, wherein, in the Tx mode, the two-port devices and the transmission lines of each assembly can resonate together and be employed as one Tx coil.

A fifth example embodiment comprises the third example embodiment, wherein, in the Rx mode, the two-port devices of each assembly can be used as an array coil.

A sixth example embodiment comprises the first example embodiment, wherein, in the Tx mode, the plurality of assemblies can be driven as a pTx coil.

The following examples are additional embodiments.

Example 1 is a magnetic resonance imaging (MRI) radio frequency (RF) coil array configured to operate in at least one of a transmit (Tx) mode or a receive (Rx) mode, the MRI RF coil array comprising: a plurality of assemblies, wherein each assembly of the plurality of assemblies comprises: a two-port device of that assembly, wherein the two-port device of that assembly is similar to the two-port device of each other assembly of the plurality of assemblies, and wherein the two-port device of that assembly comprises at least one associated inductor configured to, in the Tx mode, generate at least a portion of a B1 field; and a transmission line of that assembly, wherein the plurality of assemblies are connected together in a loop.

Example 2 comprises the subject matter of any variation of any of example(s) 1, wherein, for each assembly of the plurality of assemblies, the two-port device of that assembly comprises one or more switches that are configured to selectively connect at least part of that two-port device to the transmission line of that assembly.

Example 3 comprises the subject matter of any variation of any of example(s) 2, wherein, for each assembly of the plurality of assemblies, the one or more switches of the two-port device of that assembly are configured to connect the at least part of that two-port device to the transmission line of that assembly in the Tx mode, and to disconnect the at least part of that two-port device from the transmission line of that assembly in the Rx mode.

Example 4 comprises the subject matter of any variation of any of example(s) 3, wherein, for each assembly of the plurality of assemblies, the one or more switches of the two-port device of that assembly are PIN diodes.

Example 5 comprises the subject matter of any variation of any of example(s) 3-4, wherein, in the Tx mode, the plurality of assemblies are configured to resonate together as a single Tx coil.

Example 6 comprises the subject matter of any variation of any of example(s) 3-5, wherein, in the Rx mode, the plurality of assemblies are configured to separately operate as individual elements of an array coil.

Example 7 comprises the subject matter of any variation of any of example(s) 1-6, wherein, in the Tx mode, the plurality of assemblies are configured to be driven as a parallel Tx (pTx) coil.

Example 8 comprises the subject matter of any variation of any of example(s) 1-7, wherein, for each assembly of the plurality of assemblies, the two-port device of that assembly comprises one or more tuning elements that facilitate tuning of the two-port device of that assembly.

Example 9 comprises the subject matter of any variation of any of example(s) 1-8, further comprising a tuning assembly that facilitates tuning of the plurality of assemblies.

Example 10 comprises the subject matter of any variation of any of example(s) 1-9, wherein, for each assembly of the plurality of assemblies, the two-port device of that assembly comprises at least one of a shunt, a serial impedance, an L network, a T network, or a π network.

Example 11 comprises the subject matter of any variation of any of example(s) 1-10, wherein the MRI coil array is arranged in a cylindrical shape, and is configured to perform MR imaging of at least one of a head, a knee, or a wrist of a patient.

Example 12 comprises the subject matter of any variation of any of example(s) 1-11, wherein the MRI coil array is at least part of a flat coil, and is configured to perform MR imaging of a spine of a patient.

Example 13 is a magnetic resonance imaging (MRI) radio frequency (RF) coil array configured to operate in at least one of a transmit (Tx) mode or a receive (Rx) mode, the MRI RF coil array comprising: N identical two-port devices, wherein N is an integer greater than one, and wherein each two-port device of the N identical two-port devices comprises at least one associated inductor configured to, in the Tx mode, generate at least a portion of a B1 field; and N transmission lines, wherein a length of each transmission line of the N transmission lines is the same as a length of each other transmission line of the N transmission lines, wherein the N identical two-port devices and N transmission lines are connected together in a loop, wherein each two-port device of the N identical two-port devices is connected between two transmission lines of the N transmission lines.

Example 14 comprises the subject matter of any variation of any of example(s) 13, wherein, for each two-port device of the N identical two-port devices comprises one or more switches that are configured to connect at least part of that two-port device to the loop in the Tx mode, and to disconnect the at least part of that two-port device from the loop in the Rx mode.

Example 15 comprises the subject matter of any variation of any of example(s) 14, wherein, in the Tx mode, the N identical two-port devices and N transmission lines are configured to resonate together as a single Tx coil.

Example 16 comprises the subject matter of any variation of any of example(s) 14-15, wherein, in the Rx mode, the N identical two-port devices are configured to separately operate as individual elements of an array coil.

Example 17 comprises the subject matter of any variation of any of example(s) 13-16, wherein, in the Tx mode, the N identical two-port devices are configured to be driven as a parallel Tx (pTx) coil.

Example 18 comprises the subject matter of any variation of any of example(s) 13-17, wherein, each two-port device of the N identical two-port devices comprises at least one of a shunt, a serial impedance, an L network, a T network, or a π network.

Example 19 is a magnetic resonance imaging (MRI) apparatus, comprising: a MRI radio frequency (RF) coil array configured to operate in at least one of a transmit (Tx) mode or a receive (Rx) mode, the MRI RF coil array comprising: a plurality of assemblies, wherein each assembly of the plurality of assemblies comprises: a two-port device of that assembly, wherein the two-port device of that assembly is similar to the two-port device of each other assembly of the plurality of assemblies, and wherein the two-port device of that assembly comprises at least one associated inductor configured to, in the Tx mode, generate at least a portion of a B1 field; and a transmission line of that assembly, wherein the plurality of assemblies are connected together in a loop.

Example 20 comprises the subject matter of any variation of any of example(s) 19, wherein, for each assembly of the plurality of assemblies, the two-port device of that assembly comprises at least one of a shunt, a serial impedance, an L network, a T network, or a π network.

Example 21 is a MRI apparatus comprising a MRI RF coil according to any variation of any of example(s) 1-20.

Circuits, apparatus, elements, MRI RF coils, arrays, methods, and other embodiments described herein are described with reference to the drawings in which like reference numerals are used to refer to like elements throughout, and where the illustrated structures are not necessarily drawn to scale. Embodiments are to cover all modifications, equivalents, and alternatives falling within the scope of the disclosure and appended claims. In the figures, the thicknesses of lines, layers and/or regions may be exaggerated for clarity. Nothing in this detailed description (or drawings included herewith) is admitted as prior art.

Like numbers refer to like or similar elements throughout the description of the figures. When an element is referred to as being "connected" to another element, it can be directly connected to the other element or intervening elements may be present. In contrast, when an element is referred to as being "directly connected" to another element, there are no intervening elements present. Other words used to describe the relationship between elements should be interpreted in a like fashion (e.g., "between" versus "directly between," "adjacent" versus "directly adjacent," etc.).

In the above description some components may be displayed in multiple figures carrying the same reference signs, but may not be described multiple times in detail. A detailed description of a component may then apply to that component for all its occurrences.

The following includes definitions of selected terms employed herein. The definitions include various examples or forms of components that fall within the scope of a term and that may be used for implementation. The examples are not intended to be limiting. Both singular and plural forms of terms may be within the definitions.

References to "one embodiment", "an embodiment", "various embodiments," "one example", "an example", or "various examples" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrases "in one embodiment" or "in various embodiments" does not necessarily refer to the same embodiment(s), though it may.

"Circuit", as used herein, includes but is not limited to hardware, firmware, or combinations of each to perform a function(s) or an action(s), or to cause a function or action from another circuit, logic, method, or system. Circuit can include a software controlled microprocessor, a discrete logic (e.g., ASIC), an analog circuit, a digital circuit, a programmed logic device, a memory device containing instructions, and other physical devices. A circuit can include one or more gates, combinations of gates, or other circuit components. Where multiple logical circuits are described, it may be possible to incorporate the multiple logical circuits into one physical circuit. Similarly, where a single logical circuit is described, it may be possible to distribute that single logical logic between multiple physical circuits.

"Computer-readable storage device", as used herein, refers to a device that stores instructions or data. "Computer-readable storage device" does not refer to propagated signals. A computer-readable storage device can take forms, including, but not limited to, non-volatile media, and volatile media. Non-volatile media can include, for example, optical disks, magnetic disks, tapes, and other media. Volatile media can include, for example, semiconductor memories, dynamic memory, and other media. Common forms of a computer-readable storage device can include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". The term "and/or" is used in the same manner, meaning "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store can store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

Although the subject matter has been described in language specific to structural features or methodological acts, it is to be understood that the subject matter defined in the appended claims is not necessarily limited to the specific features or acts described above. Rather, the specific features and acts described above are disclosed as example forms of implementing the claims.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature can be combined with one or more other features of the other implementations as may be desired and advantageous for any given or particular application.

What is claimed is:

1. A magnetic resonance imaging (MRI) radio frequency (RF) coil array configured to operate in at least one of a transmit (Tx) mode or a receive (Rx) mode, the MRI RF coil array comprising:
a plurality of assemblies, wherein each assembly of the plurality of assemblies comprises:
a two-port device of that assembly, wherein the two-port device of that assembly is similar to the two-port device of each other assembly of the plurality of assemblies, and wherein the two-port device of that assembly comprises at least one associated inductor configured to, in the Tx mode, generate at least a portion of a $B_1$ field; and
a transmission line of that assembly, wherein the plurality of assemblies are connected together in a loop.

2. The MRI RF coil array of claim 1, wherein, for each assembly of the plurality of assemblies, the two-port device of that assembly comprises one or more switches that are configured to selectively connect at least part of that two-port device to the transmission line of that assembly.

3. The MRI RF coil array of claim 2, wherein, for each assembly of the plurality of assemblies, the one or more switches of the two-port device of that assembly are configured to connect the at least part of that two-port device to the transmission line of that assembly in the Tx mode, and to disconnect the at least part of that two-port device from the transmission line of that assembly in the Rx mode.

4. The MRI RF coil array of claim 3, wherein, for each assembly of the plurality of assemblies, the one or more switches of the two-port device of that assembly are PIN diodes.

5. The MRI RF coil array of claim 3, wherein, in the Tx mode, the plurality of assemblies are configured to resonate together as a single Tx coil.

6. The MRI RF coil array of claim 3, wherein, in the Rx mode, the plurality of assemblies are configured to separately operate as individual elements of an array coil.

7. The MRI RF coil array of claim 1, wherein, in the Tx mode, the plurality of assemblies are configured to be driven as a parallel Tx (pTx) coil.

8. The MRI RF coil array of claim 1, wherein, for each assembly of the plurality of assemblies, the two-port device of that assembly comprises one or more tuning elements that facilitate tuning of the two-port device of that assembly.

9. The MRI RF coil array of claim 1, further comprising a tuning assembly that facilitates tuning of the plurality of assemblies.

10. The MRI RF coil array of claim 1, wherein, for each assembly of the plurality of assemblies, the two-port device of that assembly comprises at least one of a shunt, a serial impedance, an L network, a T network, or a π network.

11. The MRI RF coil array of claim 1, wherein the MRI RF coil array is arranged in a cylindrical shape, and is configured to perform MR imaging of at least one of a head, a knee, or a wrist of a patient.

12. The MRI RF coil array of claim 1, wherein the MRI RF coil array is at least part of a flat coil, and is configured to perform MR imaging of a spine of a patient.

13. A magnetic resonance imaging (MRI) radio frequency (RF) coil array configured to operate in at least one of a transmit (Tx) mode or a receive (Rx) mode, the MRI RF coil array comprising:
N identical two-port devices, wherein N is an integer greater than one, and wherein each two-port device of the N identical two-port devices comprises at least one associated inductor configured to, in the Tx mode, generate at least a portion of a $B_1$ field; and
N transmission lines, wherein a length of each transmission line of the N transmission lines is the same as a length of each other transmission line of the N transmission lines,
wherein the N identical two-port devices and the N transmission lines are connected together in a loop, wherein each two-port device of the N identical two-port devices is connected between two transmission lines of the N transmission lines.

14. The MRI RF coil array of claim 13, wherein, each two-port device of the N identical two-port devices comprises one or more switches that are configured to connect at least part of that two-port device to the loop in the Tx mode, and to disconnect the at least part of that two-port device from the loop in the Rx mode.

15. The MRI RF coil array of claim 14, wherein, in the Tx mode, the N identical two-port devices and the N transmission lines are configured to resonate together as a single Tx coil.

16. The MRI RF coil array of claim 14, wherein, in the Rx mode, the N identical two-port devices are configured to separately operate as individual elements of an array coil.

17. The MRI RF coil array of claim 13, wherein, in the Tx mode, the N identical two-port devices are configured to be driven as a parallel Tx (pTx) coil.

18. The MRI RF coil array of claim 13, wherein each two-port device of the N identical two-port devices comprises at least one of a shunt, a serial impedance, an L network, a T network, or a π network.

19. A magnetic resonance imaging (MRI) apparatus, comprising:
a MRI radio frequency (RF) coil array configured to operate in at least one of a transmit (Tx) mode or a receive (Rx) mode, the MRI RF coil array comprising:
a plurality of assemblies, wherein each assembly of the plurality of assemblies comprises:
a two-port device of that assembly, wherein the two-port device of that assembly is similar to the two-port device of each other assembly of the plurality of assemblies, and wherein the two-port device of that assembly comprises at least one associated inductor configured to, in the Tx mode, generate at least a portion of a $B_1$ field; and
a transmission line of that assembly, wherein the plurality of assemblies are connected together in a loop.

20. The MRI apparatus of claim 19, wherein, for each assembly of the plurality of assemblies, the two-port device of that assembly comprises at least one of a shunt, a serial impedance, an L network, a T network, or a π network.

* * * * *